United States Patent
Lee et al.

(10) Patent No.: US 7,406,108 B2
(45) Date of Patent: Jul. 29, 2008

(54) VERTICAL EXTERNAL CAVITY SURFACE EMITTING LASER (VECSEL)

(75) Inventors: Jun-ho Lee, Seoul (KR); Taek Kim, Suwon-si (KR); Sang-moon Lee, Suwon-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 8 days.

(21) Appl. No.: 11/500,916

(22) Filed: Aug. 9, 2006

(65) Prior Publication Data
US 2007/0165689 A1 Jul. 19, 2007

(30) Foreign Application Priority Data
Jan. 18, 2006 (KR) .................... 10-2006-0005412

(51) Int. Cl.
*H01S 3/10* (2006.01)
(52) U.S. Cl. ............... 372/22; 372/21; 372/36; 372/70
(58) Field of Classification Search .............. 372/36, 372/22, 21, 70
See application file for complete search history.

(56) References Cited

U.S. PATENT DOCUMENTS

| | | | |
|---|---|---|---|
| 5,436,920 A * | 7/1995 | Minemoto et al. | 372/21 |
| 6,097,742 A | 8/2000 | Caprara et al. | |
| 6,370,168 B1 * | 4/2002 | Spinelli | 372/22 |
| 6,735,234 B1 | 5/2004 | Paschotta et al. | |
| 2005/0036528 A1 | 2/2005 | Schmid | |
| 2007/0110118 A1 * | 5/2007 | Kim et al. | 372/99 |
| 2007/0116078 A1 * | 5/2007 | Kim | 372/50.124 |

* cited by examiner

*Primary Examiner*—Dung T Nguyen
(74) *Attorney, Agent, or Firm*—Buchanan Ingersoll & Rooney PC

(57) ABSTRACT

The VECSEL includes: a heat spreader dissipating generated heat; a laser chip that is disposed on the heat spreader and is excited by a pump beam of a predetermined wavelength to emit a beam of a first wavelength; a Second Harmonic Generation (SHG) crystal that is disposed on the laser chip or the heat spreader and converts the laser beam of the first wavelength emitted from the laser chip into a beam having a second wavelength that is one-half the first wavelength; and a planar external cavity mirror that is directly formed on the SHG crystal and has a predetermined transmittance with respect to the beam of the second wavelength.

20 Claims, 6 Drawing Sheets

VERTICAL EXTERNAL CAVITY SURFACE EMITTING LASER (VECSEL)

CROSS-REFERENCE TO RELATED PATENT APPLICATION

Priority is claimed to Korean Patent Application No. 10-2006-0005412, filed on Jan. 18, 2006, in the Korean Intellectual Property Office, the disclosure of which is incorporated herein in its entirety by reference.

BACKGROUND OF THE DISCLOSURE

1. Field of the Disclosure

The present disclosure relates to an end-pumped vertical external cavity surface emitting laser (VECSEL), and more particularly, to a VECSEL having improved optical structure with improved mirror forming an external cavity.

2. Description of the Related Art

VECSELs increase a gain region by adopting an external mirror instead of an upper, integral mirror for a Vertical Cavity Surface Emitting Laser (VCSEL) and obtains a high output power of several to several tens of watts (W) or higher.

FIG. 1 illustrates optical arrangement of a conventional front-pumped VECSEL. Referring to FIG. 1, the conventional VECSEL includes a pumping unit providing a pump beam, a laser chip 11 that is excited by a pump beam to emit a laser beam, and first and second mirrors 17 and 19 that are located outside the laser chip 11 and form an external cavity.

The pumping unit includes a pumping light source 1 mounted on a first heat sink 3 and a collimating lens 5 collimating a pump beam emitted by the pumping light source 1 and provides a pump beam to a portion of the laser chip from which a laser beam is emitted.

A second heat sink 13 is disposed on one surface of the laser chip 11 and dissipates heat generated by the laser chip 11.

The first mirror 17 is separated from the laser chip 11 and is obliquely disposed relative to an axis of incident light emitted from the laser chip 11. The first mirror 17 has a concave reflecting surface 17a facing the laser chip 11 and the second mirror 19. Thus, the first mirror 17 prevents a laser beam resonating between the second mirror 19 and the laser chip 11 from diverging. The second mirror 19 faces the first mirror 17 and reflects light from the first mirror 17 back into the first mirror 17.

A birefringent filter 15 is disposed between the first mirror 17 and the laser chip 11 and filters out all but a laser beam having a predetermined wavelength. A Second Harmonic Generation (SHG) crystal 21 is disposed between the first and second mirrors 17 and 19 and converts the laser beam emitted from the laser chip 11 to its half wavelength beam.

Meanwhile, because the external cavity mirror 17 for the conventional VECSEL of FIG. 1 having the above-mentioned construction has the concave reflecting surface 17a, it is difficult to integrate the external cavity mirror 17 with the laser chip and form a VECSEL as an integrated module. This makes it difficult to reduce the size of VECSEL to less than several to several tens of millimeters (mm).

SUMMARY OF THE DISCLOSURE

The present disclosure provides a compact vertical external cavity surface emitting laser (VECSEL) with integrated optical elements by improving the structure of a mirror forming an external cavity.

According to an aspect of the present disclosure, there is provided a Vertical External Cavity Surface Emitting Laser (VECSEL) including: a heat spreader dissipating generated heat; a laser chip that is disposed on the heat spreader and is excited by a pump beam of a predetermined wavelength to emit a beam of a first wavelength; an SHG (Second Harmonic Generation) crystal that is disposed on the laser chip or the heat spreader and converts the laser beam of the first wavelength emitted from the laser chip into a beam having a second wavelength that is one-half the first wavelength; and a planar external cavity mirror that is directly formed on the SHG crystal and has a predetermined transmittance with respect to the beam of the second wavelength.

According to another embodiment of the present disclosure, the VECSEL includes: a laser chip that is excited by an externally emitted pump beam to emit light of a first wavelength; a heat spreader that is disposed on the laser chip and dissipates heat away from the laser chip; an SHG (Second Harmonic Generation) crystal that is disposed on the heat spreader and converts the laser beam of the first wavelength emitted from the laser chip into a beam having a second wavelength that is one-half the first wavelength; and a planar external cavity mirror that is directly formed on the SHG crystal and has a predetermined transmittance with respect to the beam of the second wavelength.

In this case, the planar external cavity mirror is a planar mirror or a dielectric coating layer that reflects the beam of the first wavelength toward the laser chip and transmits a portion of the beam of the second wavelength.

BRIEF DESCRIPTION OF THE DRAWINGS

The above and other features and advantages of the present disclosure will become more apparent by describing in detail exemplary embodiments thereof with reference to the attached drawings in which.

DETAILED DESCRIPTION OF THE DISCLOSURE

A vertical external cavity surface emitting laser (VECSEL) according to a preferred embodiment of the present disclosure will now be described more fully with reference to the accompanying drawings.

Figure 1:
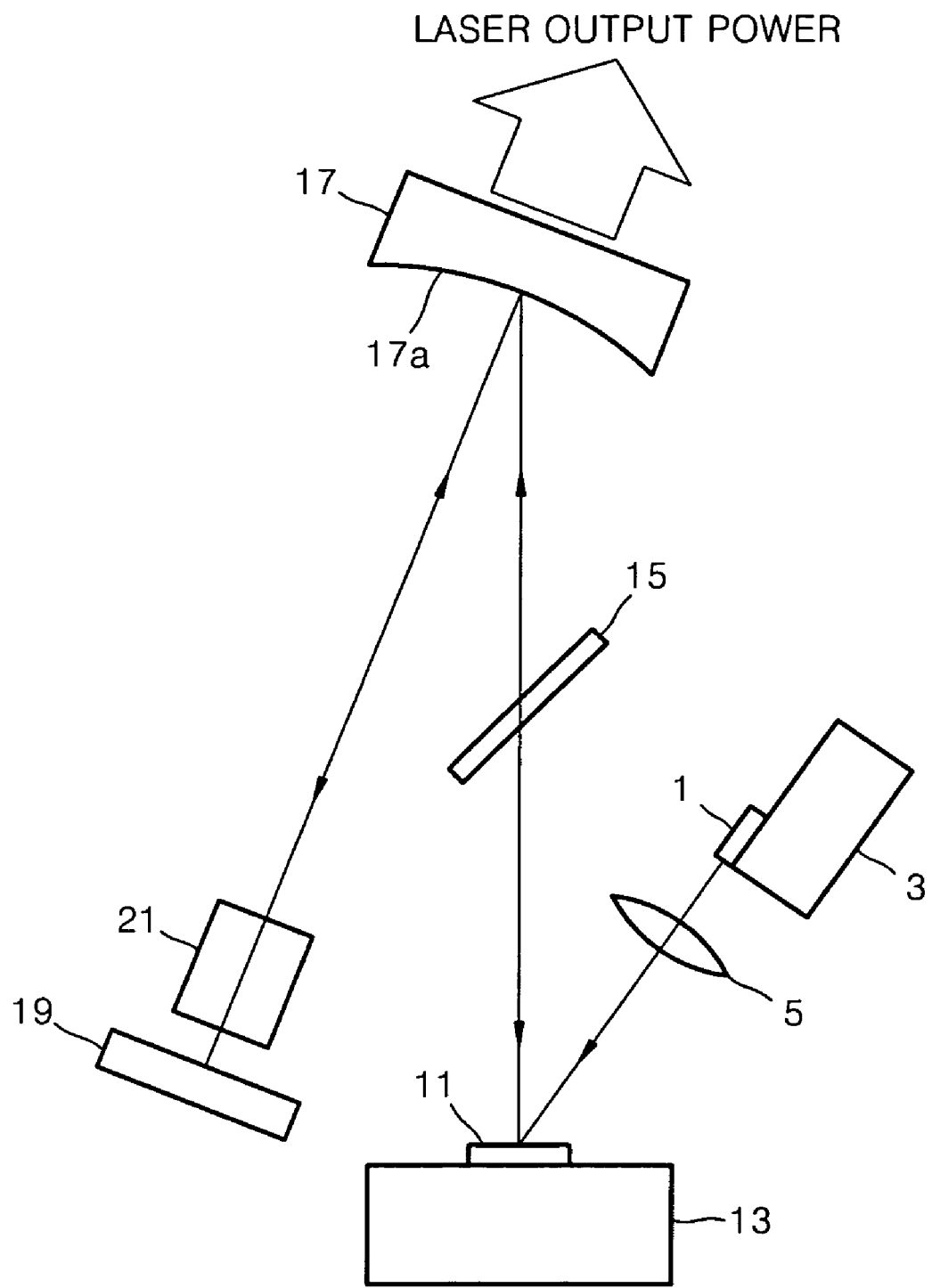
FIG. 1 illustrates optical arrangement of a conventional front-pumped vertical external cavity surface emitting laser (VECSEL)
Figure 2:
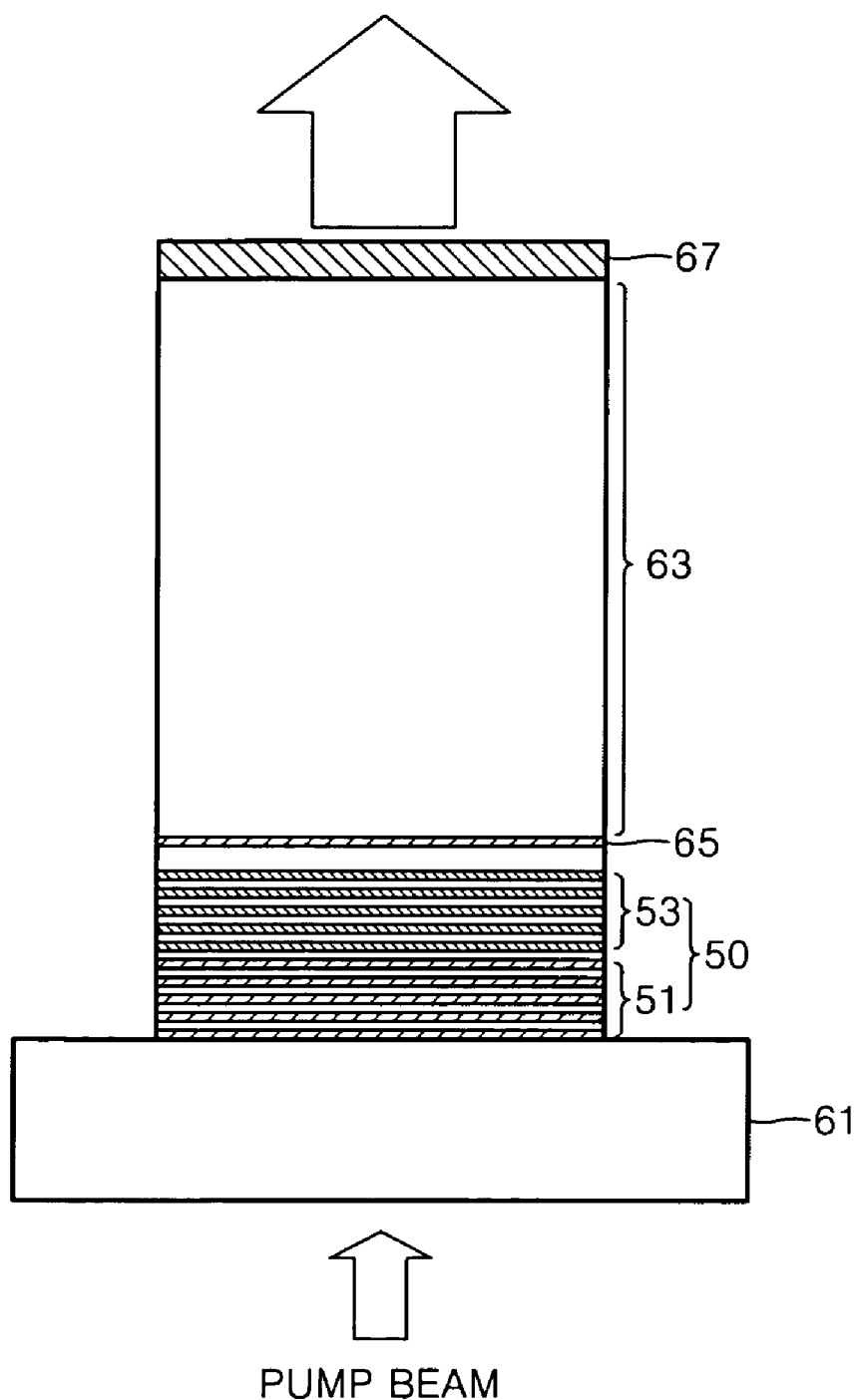
FIG. 2 schematically illustrates a VECSEL according to an embodiment of the present disclosure.

FIG. 2 is a schematic cross-sectional view of an end-pumped VECSEL according to an embodiment of the present disclosure. Referring to FIG. 2, the end-pumped VECSEL includes a heat spreader 61, a laser chip 50, a second harmonic generation (SHG) crystal 63, and a planar external cavity mirror 67. The heat spreader 61 transmits a pump beam of a predetermined wavelength (e.g., 808 nm) that is externally emitted while dissipating heat away from the laser chip 50. To achieve these functions, the heat spreader 61 may be made of a material having excellent heat dissipation and optical transparency with respect to a pump beam such as diamond, silicon carbide (SiC), sapphire, AlN, GaN, or $Al_2O_3$.

The laser chip 50 includes a distributed Bragg reflector (DBR) 51 and an active layer 53. The active layer 53 has a multi-quantum well structure with Resonant Periodic Gain (RPG) and is excited by a pump beam to emit a laser beam of a first wavelength in the range between about 350 nm and several micrometers. The DBR 51 is a high-reflectance mirror layer that reflects the laser beam emitted from the active layer 53 toward the external cavity mirror 67 so that the laser beam resonates between the DBR layer 51 and the external cavity mirror 67.

The SHG crystal 63 is formed integrally with the laser chip 50 and converts the laser beam of the first wavelength emitted from the laser chip 50 into a beam having a second wavelength that is one-half the first wavelength. For example, the first and second wavelengths may be 1,064 nm and 532 nm, respectively.

The planar external cavity mirror 67 is formed directly on the SHG crystal 63 and has predetermined transmittance with respect to the beam of the second wavelength, thus causing the laser beam of the second wavelength to exit the SHG crystal 63.

The planar external cavity mirror 67 may be composed of a planar mirror that reflects the laser beam of the first wavelength toward the laser chip 50 and transmits at least a portion of the laser beam of the second wavelength. In this case, a dielectric coating layer may be formed on at least one surface of the planar mirror so as to reflect the laser beam of the first wavelength toward the laser chip 50 and transmit at least the portion of the laser beam of the second wavelength.

The planar external cavity mirror 67 may also be composed of a dielectric coating layer directly overlying the SHG crystal 63. Because the external cavity mirror 67 having a planar structure can be integrated on the SHG crystal 63, it is possible to make optical arrangement of the VECSEL compact. The external cavity mirror 67 with the above-mentioned structure uses a thermal lens effect to prevent a laser beam resonating between the laser chip 50 and the planar external cavity mirror 67 from diverging or being laterally emitted. The thermal lens effect will be described later in more detail.

The VECSEL according to the current embodiment further includes a wavelength filter 65 that is disposed between the laser chip 50 and the SHG crystal 63 and transmits the laser beam of the first wavelength and reflects the laser beam of the second wavelength toward the external cavity mirror 67. The VECSEL may further include a polarizer (not shown) that is disposed between the laser chip 50 and the SHG crystal 63 and selectively transmits light of predetermined polarization. The use of the polarizer can improve wavelength conversion efficiency in the SHG crystal 63.

Figure 3:
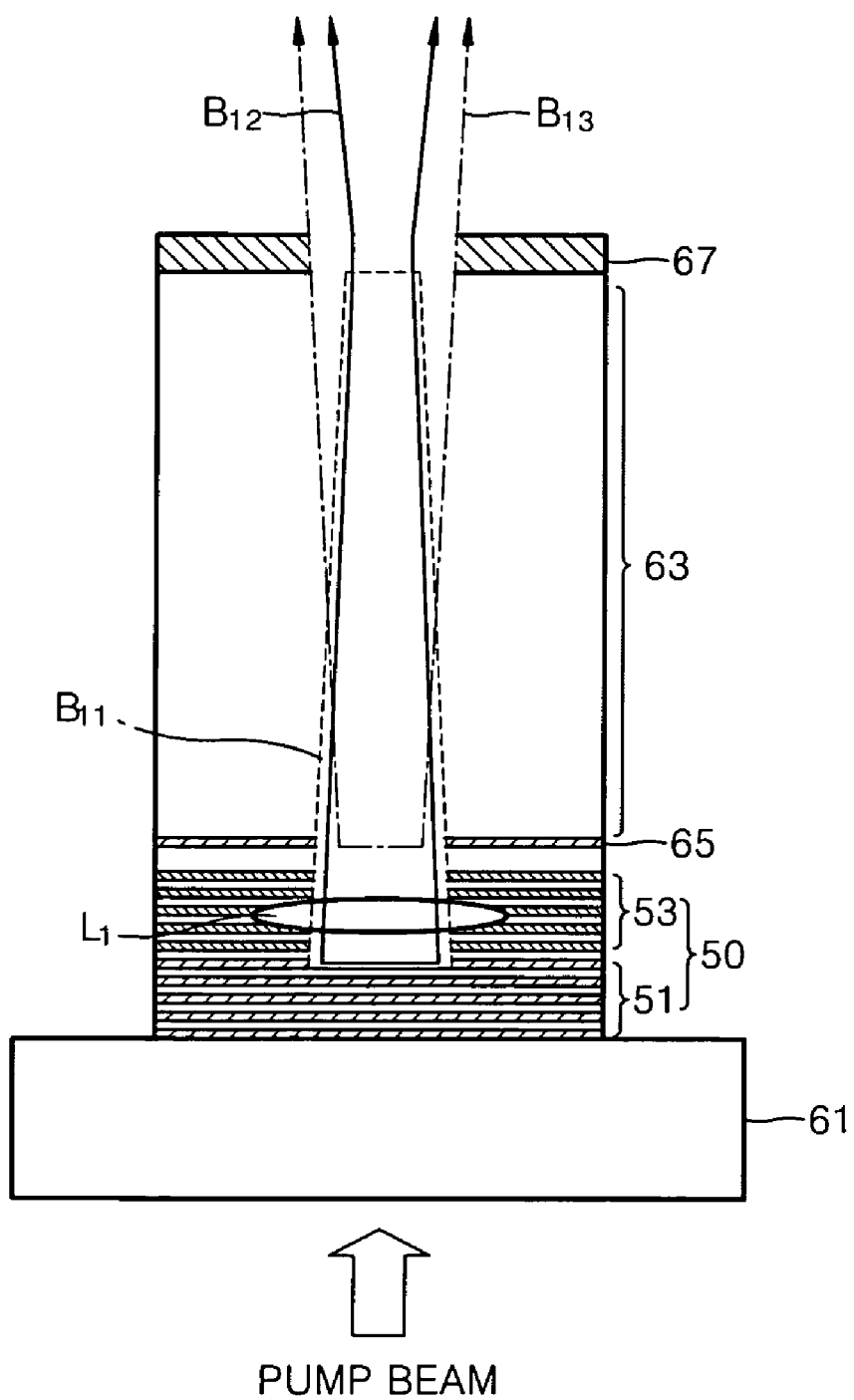
FIG. 3 illustrates a thermal lens effect induced by the VECSEL of FIG. 2 and output power obtained from a planar external cavity.

FIG. 3 illustrates output power caused by a thermal lens effect induced by the VECSEL of FIG. 2. A pump laser beam transmitted by the heat spreader 61 to the laser chip 50 has Gaussian intensity distribution. That is, the intensity of the pump beam is highest at the center and decreases toward the edges. Thus, a laser beam emitted from the laser chip 50 that is excited by the pump beam is affected by the temperature distribution of the incident pump beam. That is, an emitted laser beam acts like a lens indicated by $L_1$ is formed in the active layer 53, which is called a thermal lens effect. Due to the thermal lens effect, a beam $B_{11}$ emitted from the laser chip 50 is focused and transmitted through the wavelength filter 65 and the SHG crystal 63 to the external cavity mirror 67. A portion of the beam $B_{11}$ is converted into a beam of the second wavelength as it passes through the SHG crystal 63 once or a plurality of times. The beam of the second wavelength is transmitted out of the external cavity mirror 67.

Meanwhile, a beam $B_{13}$ that is subjected to conversion into a beam of the second wavelength as it is reflected from the external cavity mirror 67 toward the laser chip 50 is not incident on the laser chip 50 but reflected again from the wavelength filter 65. Thus, because the beam $B_{13}$ is not subjected to a thermal lens effect and is wavelength-converted, it diverges toward the external cavity mirror 67 and is then output through the external cavity mirror 67 with little loss.

A beam $B_{12}$ that is not subjected to wavelength conversion as it is reflected from the external cavity mirror 67 toward the laser chip 50 is transmitted through the wavelength filter 65 to the laser chip 50. The beam $B_{12}$ is then reflected again from the DBR 51 so that it is focused within the laser chip 50 due to the thermal lens effect and propagates toward the external cavity mirror 67.

Figure 4:
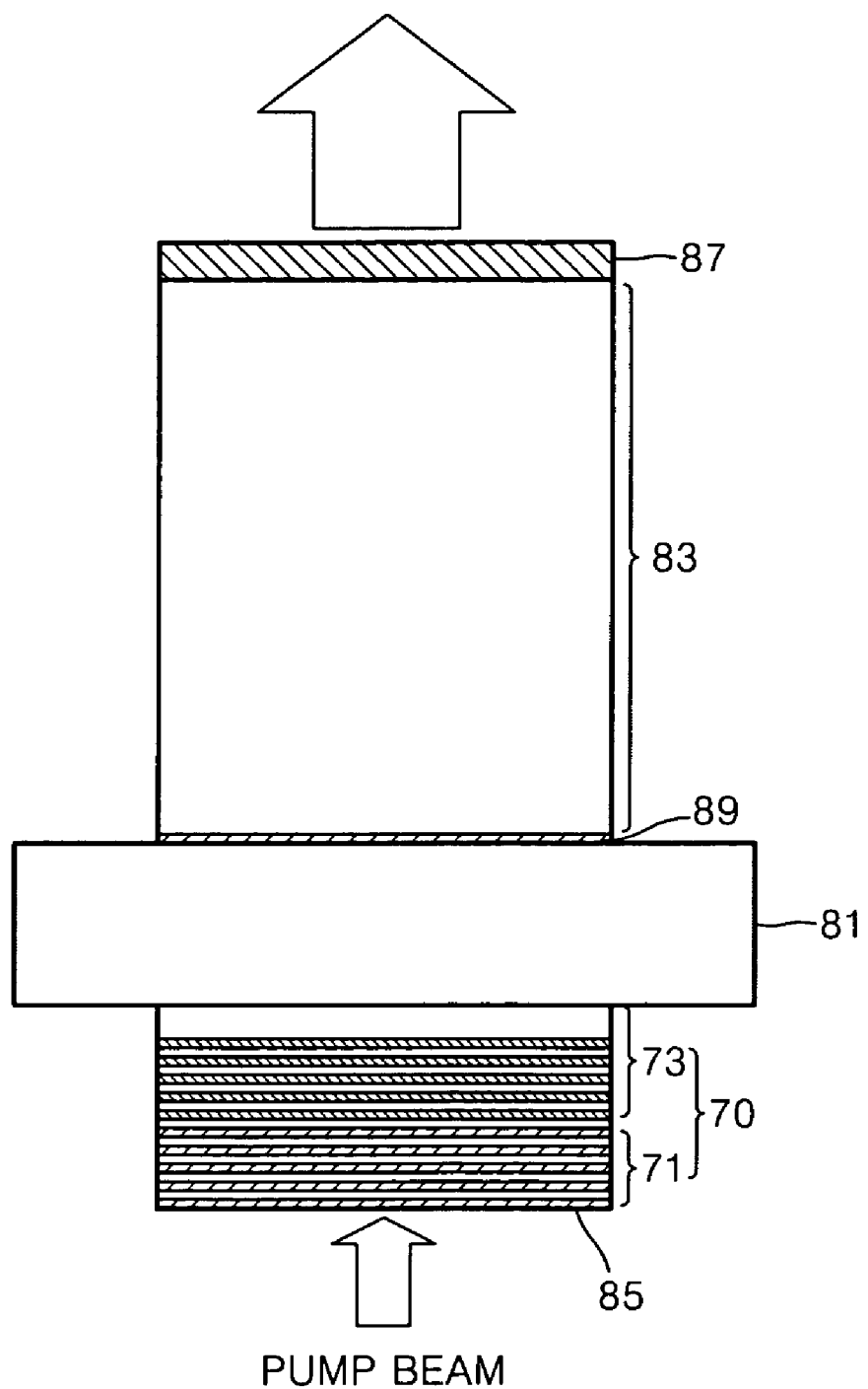
FIG. 4 schematically illustrates a VECSEL according to another embodiment of the present disclosure.

FIG. 4 is a schematic cross-sectional view of an end-pumped VECSEL according to another embodiment of the present disclosure. Referring to FIG. 4, the VECSEL includes a laser chip 70, a heat spreader 81, an SHG crystal 83 and a planar external cavity mirror 87 that are integrally disposed in the order that a pump beam is incident.

The laser chip 70 includes a DBR 71 and an active layer 73. The active layer 73 is excited by a pump beam to emit a laser beam of a first wavelength, e.g., 1,064 nm. The DBR 71 reflects the laser beam of the first wavelength emitted from the active layer 73 toward the external cavity mirror 87.

The heat spreader 81 is disposed between the laser chip 70 and the SHG crystal 83 and transmits a pump beam of a predetermined wavelength (e.g., 808 nm) that is externally emitted while dissipating heat away from the laser chip 70.

The SHG crystal 83 is formed integrally with the laser chip 70 and converts the laser beam of the first wavelength emitted from the laser chip 70 into a beam having a second wavelength that is one-half the first wavelength. For example, the first and second wavelengths may be 1,064 nm and 532 nm, respectively.

The planar external cavity mirror 87 is formed directly on the SHG crystal 83 and has predetermined transmittance with respect to the beam of the second wavelength, thus causing the laser beam of the second wavelength to exit the SHG crystal 83.

The planar external cavity mirror 87 may be composed of a planar mirror that reflects the laser beam of the first wavelength toward the laser chip 70 and transmits at least a portion of the laser beam of the second wavelength. In this case, a dielectric coating layer may be formed on at least one surface of the planar mirror so as to reflect the laser beam of the first wavelength toward the laser chip 70 and transmit at least the portion of the laser beam of the second wavelength.

The planar external cavity mirror 87 may be composed of a dielectric coating layer directly overlying the SHG crystal 83 instead of the planar mirror.

The VECSEL according to the current embodiment further includes a wavelength filter 89 that is disposed between the heat spreader 81 and the SHG crystal 83 and transmits the laser beam of the first wavelength and reflects the laser beam of the second wavelength toward the external cavity mirror 87. The VECSEL may further include a polarizer (not shown) that is disposed between the laser chip 70 and the SHG crystal 83 and selectively transmits light of predetermined polarization. The user of the polarizer can improve wavelength conversion efficiency in the SHG crystal 83.

The VECSEL may further include an anti-reflective coating layer 85 that is disposed on one surface of the laser chip 70, i.e., a bottom surface of the DBR 71, on which a pump beam is incident, and prevents the pump beam from being reflected from the DBR 71.

Figure 5:
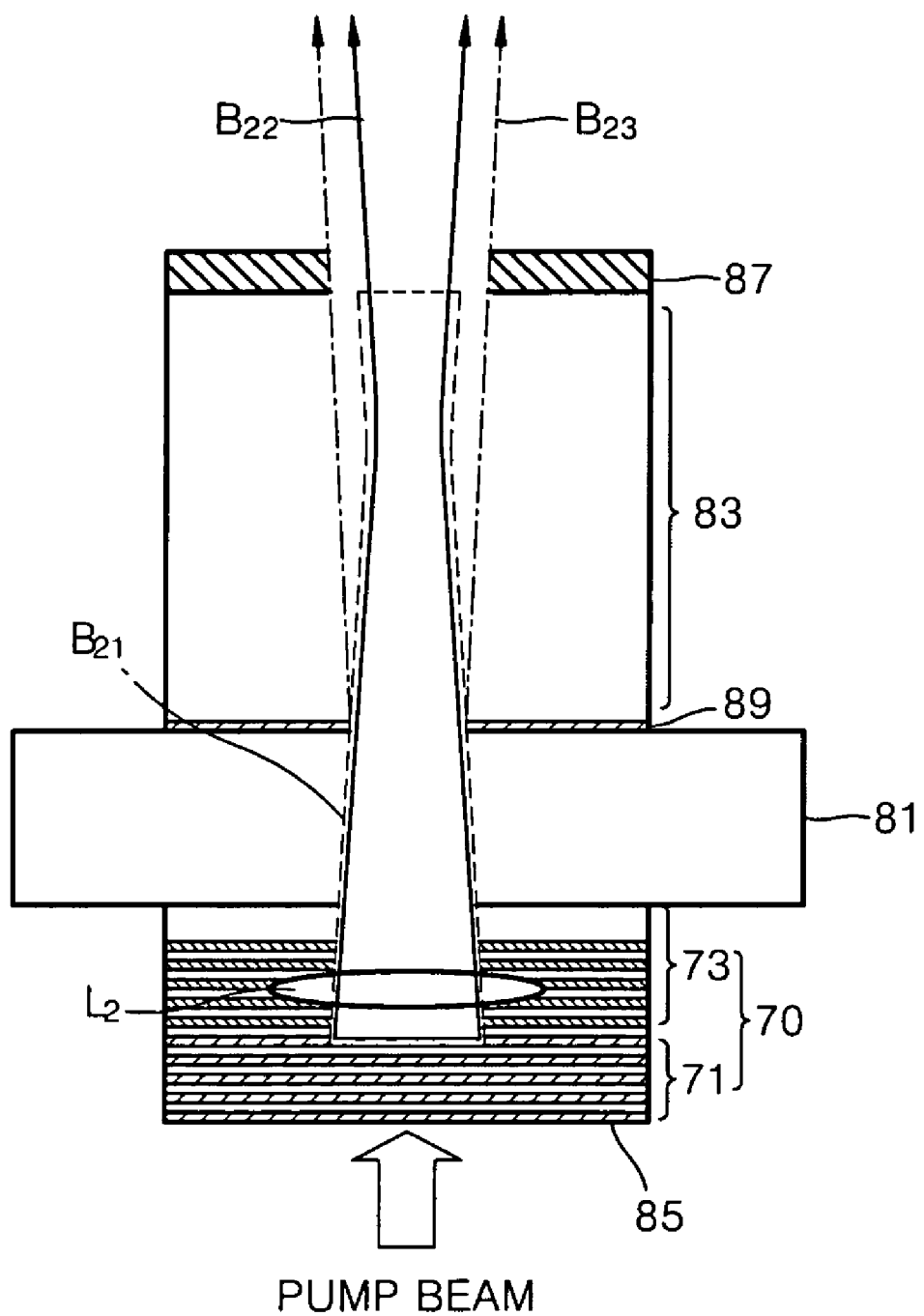
FIG. 5 illustrates laser output power caused by a thermal lens effect induced by the VECSEL of FIG. 4.

FIG. 5 illustrates laser output power caused by a thermal lens effect induced by the VECSEL of FIG. 4. A pump laser beam that is emitted onto the laser chip 70 has Gaussian intensity distribution. Thus, a laser beam emitted from the laser chip 70 that is excited by the pump beam is affected by the temperature distribution of the incident pump beam. That is, an emitted laser beam acts like a lens indicated by $L_2$ is formed in the active layer 73, which is called a thermal lens effect. Due to the thermal lens effect, a beam $B_{21}$ emitted from the laser chip 70 is focused and transmitted through the wavelength filter 89 and the SHG crystal 83 to the external cavity mirror 87. A portion of the beam $B_{21}$ is converted into a beam of the second wavelength as it passes through the SHG crystal 83 once or a plurality of times. The beam of the second wavelength is transmitted through of the external cavity mirror 87.

Meanwhile, a beam $B_{23}$ that is subjected to conversion into a beam of the second wavelength as it is reflected from the external cavity mirror 87 toward the laser chip 70 is not incident on the laser chip 70 but reflected again from the wavelength filter 89. Thus, because the beam $B_{23}$ is not subjected to a thermal lens effect and is wavelength-converted, it diverges toward the external cavity 87 and is then output through the external cavity mirror 87 with little loss.

A beam $B_{22}$ that is not subjected to wavelength conversion as it is reflected from the external cavity toward the laser chip 70 is transmitted through the wavelength filter 89 to the laser chip 70. The beam $B_{22}$ is then reflected again from the DBR 71 so that it is focused within the laser chip 70 due to the thermal lens effect and propagates toward the external cavity mirror 87.

Exemplary VECSELs employing the planar external cavities (defined by mirrors 67 and 87) according to the embodiments of the present disclosure utilize a thermal lens effect to prevent resonating laser light from being laterally emitted, thus achieving substantially the same laser output power as a conventional VECSEL employing a mirror having a concave surface.

Figure 6:
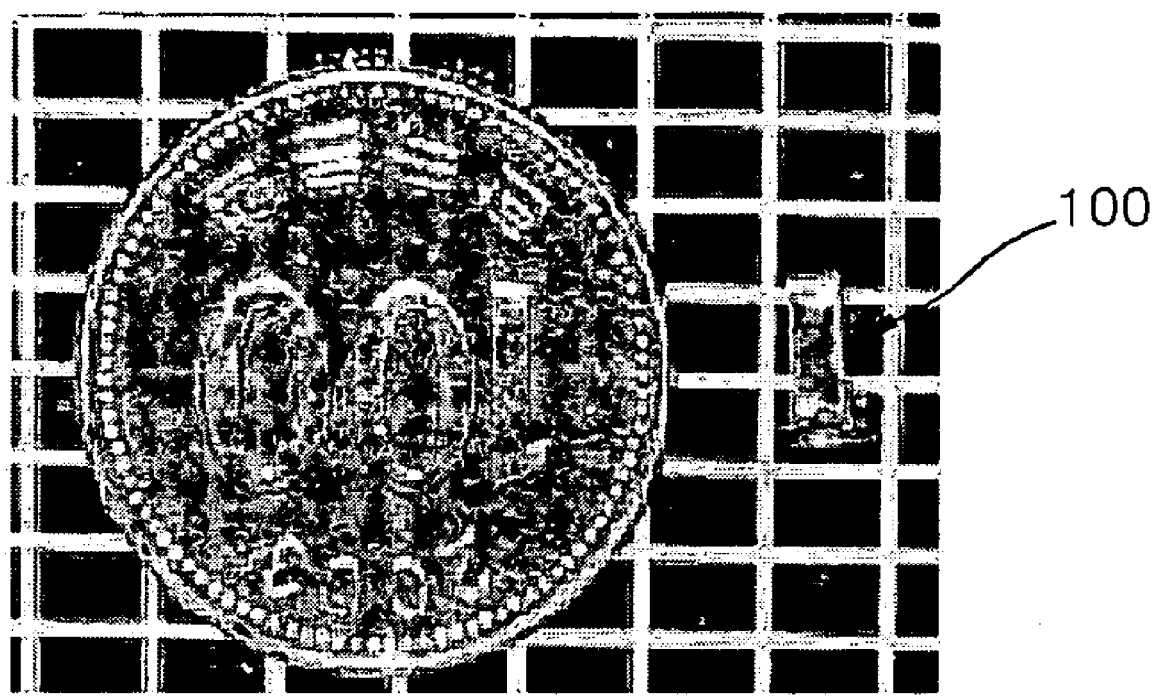
FIG. 6 illustrates a micro-sized laser output apparatus.

The VECSELs of the present disclosure also employs a planar external cavity mirror to allow integration of a heat spreader, a laser chip, an SHG crystal, and a planar external cavity mirror, thus realizing a micro-sized laser output apparatus 100 having a height of about 5 mm as illustrated in FIG. 6.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A VECSEL (Vertical External Cavity Surface Emitting Laser) comprising:
   a heat spreader dissipating generated heat;
   a laser chip that is disposed on the heat spreader and is excited by a pump beam of a predetermined wavelength to emit a beam of a first wavelength;
   an SHG (Second Harmonic Generation) crystal that is disposed on the laser chip and converts the laser beam of the first wavelength emitted from the laser chip into a beam having a second wavelength that is one-half the first wavelength; and
   a planar external cavity mirror that is directly formed on the SHG crystal and has a predetermined transmittance with respect to the beam of the second wavelength.

2. The VECSEL of claim 1, wherein the planar external cavity mirror is a planar mirror that reflects the beam of the first wavelength toward the laser chip and transmits a portion of the beam of the second wavelength.

3. The VECSEL of claim 2, further comprising a dielectric coating layer that is formed on at least one surface of the planar mirror and reflects the laser beam of the first wavelength toward the laser chip and transmits at least the portion of the laser beam of the second wavelength.

4. The VECSEL of claim 1, wherein the planar external cavity mirror is a dielectric coating layer that is directly formed on the SHG crystal and reflects the laser beam of the first wavelength toward the laser chip and transmits at least the portion of the laser beam of the second wavelength.

5. The VECSEL of claim 1, further comprising a wavelength filter that is disposed between the laser chip and the SHG crystal and transmits the beam of the first wavelength and reflects the beam of the second wavelength toward the external cavity mirror.

6. The VECSEL of claim 1, further comprising a polarizer that is disposed between the laser chip and the SHG crystal and selectively transmits light of predetermined polarization.

7. The VECSEL of claim 1, wherein the heat spreader transmits the pump beam.

8. A VECSEL (Vertical External Cavity Surface Emitting Laser) comprising:
   a laser chip that is excited by an external pump beam to emit light of a first wavelength;
   a heat spreader that is disposed on the laser chip and dissipates heat away from the laser chip;
   an SHG (Second Harmonic Generation) crystal that is disposed on the heat spreader and converts the laser beam of the first wavelength emitted from the laser chip into a beam having a second wavelength that is one-half the first wavelength; and
   a planar external cavity mirror that is directly formed on the SHG crystal and has a predetermined transmittance with respect to the beam of the second wavelength.

9. The VECSEL of claim 8, wherein the planar external cavity mirror is a planar mirror that reflects the beam of the first wavelength toward the laser chip and transmits a portion of the beam of the second wavelength.

10. The VECSEL of claim 9, further comprising a dielectric coating layer that is formed on at least one surface of the planar mirror and reflects the laser beam of the first wavelength toward the laser chip and transmits at least the portion of the laser beam of the second wavelength.

11. The VECSEL of claim 8, wherein the planar external cavity mirror is a dielectric coating layer that is directly formed on the SHG crystal and reflects the laser beam of the first wavelength toward the laser chip and transmits at least the portion of the laser beam of the second wavelength.

12. The VECSEL of claim 8, further comprising a wavelength filter that is disposed between the laser chip and the SHG crystal and transmits the beam of the first wavelength and reflects the beam of the second wavelength toward the external cavity.

13. The VECSEL of claim 8, further comprising a polarizer that is disposed between the laser chip and the SHG crystal and selectively transmits light of predetermined polarization.

14. The VECSEL of claim 8, further comprising an anti-reflective coating layer that is formed on one surface of the laser chip on which a pump beam is incident and prevents the pump beam from being reflected.

15. A VECSEL (Vertical External Cavity Surface Emitting Laser) comprising:
- a laser chip that is excited by an external pump beam to emit light of a first wavelength;
- a heat spreader that is disposed on the laser chip and dissipates heat away from the laser chip;
- an SHG (Second Harmonic Generation) crystal that is disposed on one of (1) the heat spreader and (2) the laser chip and converts the laser beam of the first wavelength emitted from the laser chip into a beam having a second wavelength that is one-half the first wavelength; and
- a planar external cavity mirror that is directly formed on the SHG crystal and has a predetermined transmittance with respect to the beam of the second wavelength.

16. The VECSEL of claim 15, wherein the planar external cavity mirror comprising a dielectric coating layer that is formed on at least one planar surface of the SHG and reflects the laser beam of the first wavelength toward the laser chip and transmits at least the portion of the laser beam of the second wavelength.

17. The VECSEL of claim 15, further comprising a wavelength filter that is disposed between the laser chip and the SHG crystal and transmits the beam of the first wavelength and reflects the beam of the second wavelength toward the external cavity.

18. The VECSEL of claim 15, further comprising a polarizer that is disposed between the laser chip and the SHG crystal and selectively transmits light of predetermined polarization.

19. The VECSEL of claim 15, further comprising an anti-reflective coating layer that is formed on one surface of the laser chip on which a pump beam is incident and prevents the pump beam from being reflected.

20. A VECSEL (Vertical External Cavity Surface Emitting Laser) comprising:
- a unit including:
    - a heat spreader dissipating generated heat, and
    - a laser chip that is adjacent to the heat spreader and is excited by a pump beam of a predetermined wavelength to emit a beam of a first wavelength;
- an SHG (Second Harmonic Generation) crystal that is disposed on the unit and converts the laser beam of the first wavelength emitted from the laser chip in a beam having a second wavelength that is one-half the first wavelength; and
- a planar external cavity mirror that is directly formed on the SHG crystal and has a predetermined transmittance with respect to the beam of the second wavelength.

* * * * *